US011455950B2

(12) United States Patent
Ma et al.

(10) Patent No.: US 11,455,950 B2
(45) Date of Patent: Sep. 27, 2022

(54) METHOD AND APPARATUS FOR ADJUSTING SIGNAL FREQUENCY, DISPLAY DEVICE AND STORAGE MEDIUM

(71) Applicants: Chengdu BOE Optoelectronics Technology Co., Ltd., Sichuan (CN); BOE Technology Group Co., Ltd., Beijing (CN)

(72) Inventors: Xiao Ma, Beijing (CN); Qianqian Liu, Beijing (CN); Chang Wang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 155 days.

(21) Appl. No.: 16/769,257

(22) PCT Filed: May 31, 2019

(86) PCT No.: PCT/CN2019/089594
§ 371 (c)(1),
(2) Date: Jun. 3, 2020

(87) PCT Pub. No.: WO2020/237648
PCT Pub. Date: Dec. 3, 2020

(65) Prior Publication Data
US 2021/0407396 A1    Dec. 30, 2021

(51) Int. Cl.
*G09G 3/3225*    (2016.01)
(52) U.S. Cl.
CPC ... *G09G 3/3225* (2013.01); *G09G 2310/0243* (2013.01); *G09G 2310/08* (2013.01);
(Continued)

(58) Field of Classification Search
CPC ............... G09G 2310/0243; G09G 2320/041
See application file for complete search history.

(56) References Cited

U.S. PATENT DOCUMENTS

| 10,790,837 | B1* | 9/2020 | Azam | H03K 3/011 |
| 2002/0133731 | A1* | 9/2002 | Johnson | G11C 7/106 |
| | | | | 713/400 |

(Continued)

FOREIGN PATENT DOCUMENTS

| CN | 102063150 A | 5/2011 |
| CN | 102682330 A | 9/2012 |

(Continued)

OTHER PUBLICATIONS

International search report of PCT application No. PCT/CN2019/089594 dated Feb. 28, 2020.

*Primary Examiner* — William Boddie
*Assistant Examiner* — Bipin Gyawali
(74) *Attorney, Agent, or Firm* — Fay Sharpe LLP

(57) ABSTRACT

A method for adjusting the signal frequency includes: acquiring a first number of times of outputting a reference signal at an active level within a reference duration, wherein a correlation between a frequency of the reference signal and temperature is less than a reference correlation threshold, the reference duration is negatively correlated with a frequency of a clock signal, a correlation between a frequency of a clock signal and temperature is greater than the reference correlation threshold, and a drive signal for driving a display device to display an image is generated based on the clock signal; acquiring a target adjustment value based on the first number of times if the first number of times is different from a reference number of times; and controlling and adjusting the frequency of the output clock signal based on the target adjustment value.

16 Claims, 6 Drawing Sheets

(52) U.S. Cl.
CPC ............... *G09G 2320/0247* (2013.01); *G09G 2320/041* (2013.01); *G09G 2370/00* (2013.01)

(56) References Cited

U.S. PATENT DOCUMENTS

| | | | | |
|---|---|---|---|---|
| 2005/0012524 | A1* | 1/2005 | Green | H03D 13/003 |
| | | | | 327/3 |
| 2008/0117157 | A1* | 5/2008 | Hwang | G09G 3/3611 |
| | | | | 345/92 |
| 2014/0368479 | A1* | 12/2014 | Bae | G09G 3/3225 |
| | | | | 345/204 |
| 2016/0070294 | A1* | 3/2016 | Chung | H03K 5/24 |
| | | | | 345/213 |
| 2017/0126279 | A1* | 5/2017 | Jung | G06F 1/04 |
| 2019/0064748 | A1* | 2/2019 | Haneda | H03K 3/0315 |
| 2019/0074958 | A1 | 3/2019 | Liao et al. | |
| 2019/0371250 | A1* | 12/2019 | Baek | G09G 3/3233 |
| 2021/0063451 | A1* | 3/2021 | Takahashi | H03K 5/135 |
| 2021/0067310 | A1* | 3/2021 | Lim | H04L 7/0004 |

FOREIGN PATENT DOCUMENTS

| | | |
|---|---|---|
| CN | 107579723 A | 1/2018 |
| CN | 109426299 A | 3/2019 |

\* cited by examiner

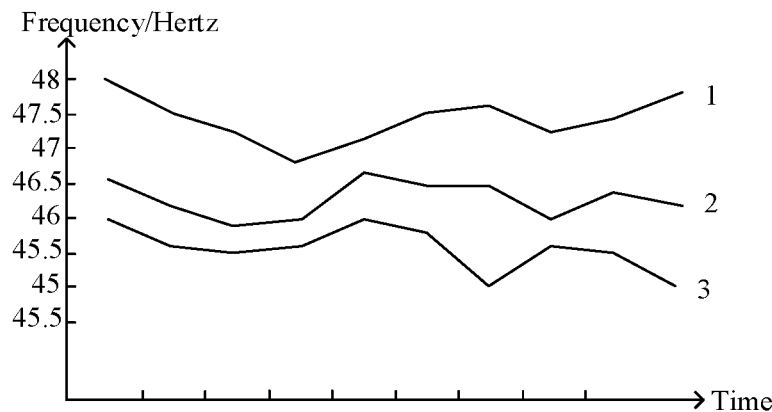

FIG. 1

```
Acquiring a first number of times of outputting a reference signal at an active
level within a reference duration, wherein a correlation between a frequency of
the reference signal and temperature is less than a reference correlation
threshold, the reference duration is negatively correlated with a frequency of a      201
clock signal, a correlation between the frequency of the clock signal and the
temperature is greater than the reference correlation threshold, and a drive
signal for driving a display device to display an image is generated based on
the clock signal
```

Acquiring a target adjustment value based on the first number of times if the first number of times is different from a reference number of times — 202

Controlling and adjusting the frequency of the output clock signal based on the target adjustment value — 203

FIG. 2

METHOD AND APPARATUS FOR ADJUSTING SIGNAL FREQUENCY, DISPLAY DEVICE AND STORAGE MEDIUM

The present application is a 371 of PCT Application No. PCT/CN2019/089594, filed on May 31, 2019, the content of which is incorporated herein by reference.

TECHNICAL FIELD

The present disclosure relates to the field of display, more particularly, relates to a method and apparatus for adjusting signal frequency, a display device and a storage medium.

BACKGROUND

In the display device, the display panel is driven by a drive signal to display an image. The drive signal is generated based on a clock signal, and the clock signal is output by the oscillator (OSC) in the drive circuit. As characteristics of components in the OSC may be affected by temperature, the frequency of the clock signal output by the OSC may be affected accordingly. However, the stable-frequency clock signal is an important factor for ensuring the display effect of the display panel. Therefore, it is of great significance to make the OSC to output stable-frequency clock signals to ensure the display effect of the display panel.

SUMMARY

The present disclosure provides a method and apparatus for adjusting a signal frequency, a display device, and a storage medium.

In one aspect, a method for adjusting a signal frequency is provided. The method includes:

acquiring a first number of times of outputting a reference signal at an active level within a reference duration, wherein a correlation between a frequency of the reference signal and temperature is less than a reference correlation threshold, the reference duration is negatively correlated with a frequency of a clock signal, a correlation between the frequency of the clock signal and the temperature is greater than the reference correlation threshold, and a drive signal for driving a display device to display an image is generated based on the clock signal;

acquiring a target adjustment value based on the first number of times if the first number of times is different from a reference number of times; and controlling and adjusting the frequency of the output clock signal based on the target adjustment value.

Optionally, the reference duration is equal to a duration consumed for outputting the clock signal at the active level for N times.

Optionally, the reference number of times is a number of times of outputting the reference signal at the active level within the reference duration determined based on a reference frequency when the frequency of the clock signal is equal to the reference frequency.

Optionally, the clock signal is output by a clock signal generator in the display device, and controlling and adjusting the frequency of the output clock signal based on the target adjustment value includes:

adjusting an amplitude of an input voltage supplied to the clock signal generator based on the target adjustment value, such that the clock signal generator is capable of adjusting the frequency of the clock signal under the adjusted input voltage.

Optionally, adjusting the amplitude of the input voltage supplied to the clock signal generator based on the target adjustment value includes:

adjusting a target parameter in an input voltage control instruction based on the target adjustment value, wherein the input voltage control instruction is intended to instruct to supply the input voltage to the clock signal generator, and the amplitude of the input voltage is determined based on the target parameter; and adjusting the amplitude of the input voltage by executing the input voltage control instruction with the target parameter adjusted.

Optionally, the amplitude of the input voltage is positively correlated with the target parameter.

Optionally, acquiring the target adjustment value based on the first number of times if the first number of times is different from the reference number of times includes:

acquiring a target difference value between the first number of times and the reference number of times; and determining an adjustment value corresponding to the target difference value as the target adjustment value based on a corresponding relationship between a difference value of number of times and the adjustment value.

Optionally, acquiring the target adjustment value based on the first number of times if the first number of times is different from the reference number of times includes:

acquiring the target adjustment value for indicating to increase the frequency of the clock signal based on the first number of times if the first number of times is greater than the reference number of times; and acquiring the target adjustment value for indicating to reduce the frequency of the clock signal based on the first number of times if the first number of times is less than the reference number of times.

Optionally, the reference duration is equal to a total duration for providing the drive signal to one row of pixel units in the display device.

Optionally, the reference signal is a data signal.

Optionally, the display device is a mobile terminal, and the reference signal is a signal transmitted by a mobile industry processor interface (MIPI).

Optionally, the clock signal is output by an oscillator circuit.

In another aspect, am apparatus for adjusting a signal frequency is provided. The apparatus includes:

a first acquisition circuit, configured to acquire a first number of times of outputting a reference signal at an active level within a reference duration, wherein a correlation between a frequency of the reference signal and temperature is less than a reference correlation threshold, the reference duration is negatively correlated with a frequency of a clock signal, a correlation between a frequency of a clock signal and temperature is greater than the reference correlation threshold, and a drive signal for driving a display device to display an image is generated based on the clock signal;

a second acquisition circuit, configured to acquire a target adjustment value based on the first number of times if the first number of times is different from the reference durations; and a control circuit, configured to control and adjust the frequency of the output clock signal based on the target adjustment value.

Optionally, the reference duration is equal to a duration consumed for outputting the clock signal at the active level for N times.

Optionally, the reference number of times is a number of times of outputting the reference signal at the active level within the reference duration determined based on the reference frequency when the frequency of the clock signal is equal to the reference frequency.

Optionally, the clock signal is output by a clock signal generator in the display device, and the control circuit is configured to: adjust an amplitude of an input voltage supplied to the clock signal generator based on the target adjustment value, such that the clock signal generator is capable of adjusting the frequency of the clock signal under the adjusted input voltage.

Optionally, the control circuit is configured to:

adjust a target parameter in an input voltage control instruction based on the target adjustment value, wherein the input voltage control instruction is intended to instruct to supply the input voltage to the clock signal generator, and the amplitude of the input voltage is determined based on the target parameter; and adjust the amplitude of the input voltage by executing the input voltage control instruction with the target parameter adjusted.

In yet another aspect, a display device is provided. The display device includes:

a processor; and a memory;

wherein the memory stores at least one program, which, when being executed by the processor, is enabled to perform the method for adjusting the signal frequency according to any one of the aforesaid when the at least one program is executed by the processor.

Optionally, the display device includes: a display panel, a clock signal generator, a reference signal generator and a voltage comparator; wherein the reference signal generator is configured to generate the reference signal and supply the reference signal to the voltage comparator;

the clock signal generator is configured to generate the clock signal and supply the clock signal to the voltage comparator; wherein the drive signal is generated based on the clock signal, and the drive signal is intended to drive the display panel to display an image; and the voltage comparator is configured to determine the reference duration based on the clock signal and under the control of the processor, and further control and adjust the frequency of the output clock signal based on the clock signal and the reference signal.

In still another aspect, a storage medium is provided. The storage medium stores a computer program, which, when being executed by a processor, is enabled to perform the method for adjusting the signal frequency according to any one of the above embodiments.

BRIEF DESCRIPTION OF THE DRAWINGS

In order to describe technical solutions in embodiments of the present disclosure more clearly, the following briefly introduces the accompanying drawings required for describing the embodiments Apparently, the accompanying drawings in the following description show merely some embodiments of the present disclosure, and reasonable changes of the accompanying drawings are included in the protection scope of the present disclosure.

FIG. 1 is a schematic diagram illustrating a change of a frequency of a clock signal output by OSC with temperature according to embodiments of the present disclosure;

FIG. 2 is a flowchart of a method for adjusting a signal frequency according to embodiments of the present disclosure;

DETAILED DESCRIPTION

Figure 3:
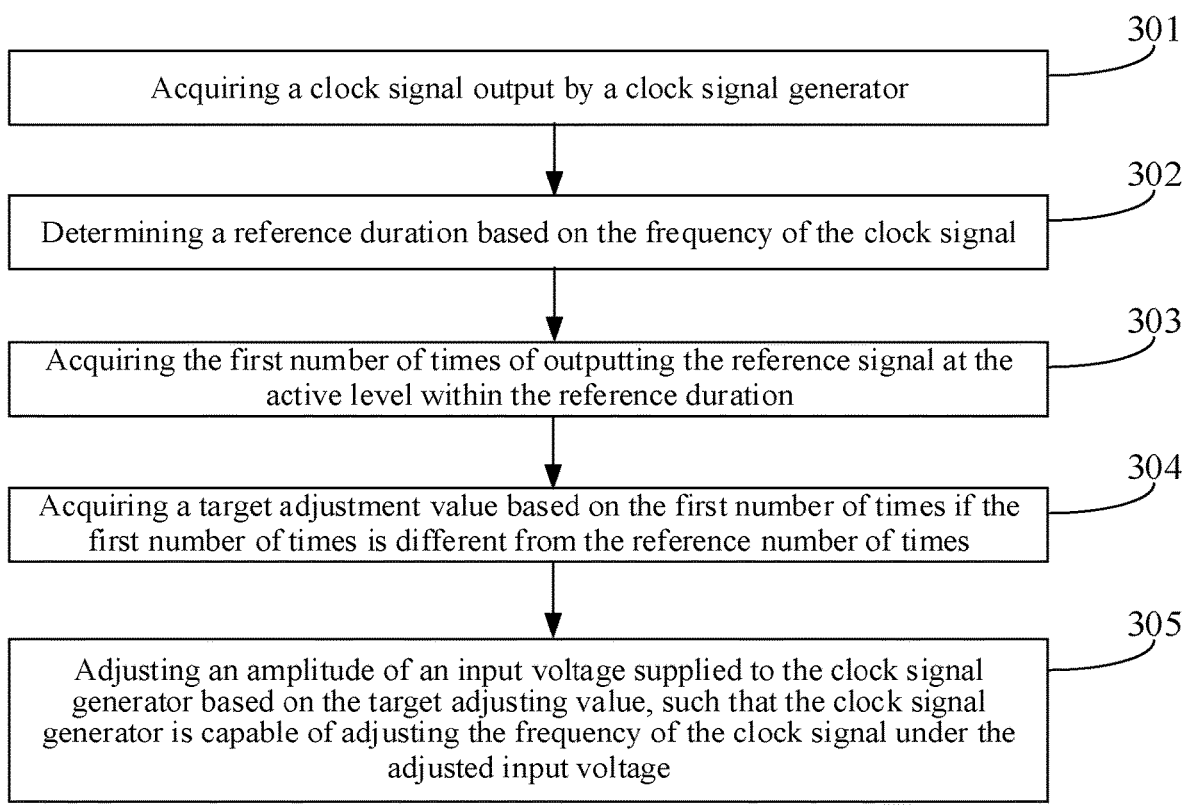
FIG. 3 is a flowchart of another method for adjusting a signal frequency according to embodiments of the present disclosure.

At present, in a display device, particularly an active matrix organic light emitting diode (AMOLED) display device, as characteristics of components in an OSC are affected by temperature, a frequency of a clock signal output by the OSC will be affected accordingly. When the frequency of the clock signal is abnormal to decrease or increase, a drive signal output based on the clock signal will be abnormal correspondingly. For example, the drive signal will have difference in transmission speed, which will result resulting in bad display, such as abnormal flashing, of a display panel.

For example, the OSC generally includes components such as a capacitor and an MOS tube. When the temperature of the AMOLED display device is higher than the room temperature, the switching frequency of the MOS tube will be reduced and a current passing through the MOS tube and a voltage loaded on the MOS tube will both be reduced with the influence of high temperature, resulting in a reduction in the frequency of the clock signal output by the OSC. When the temperature of the AMOLED display device is lower than the room temperature, the switching frequency of the MOS tube will be increased and the current passing through the MOS tube and the voltage loaded on the MOS tube will both be increased with the influence of low temperature, resulting in an increase in the frequency of the clock signal output by the OSC.

FIG. 1 is a schematic diagram illustrating a change of a frequency of a clock signal output by OSC with temperature, where a curve 1 represents the change of the frequency in a low temperature environment, a curve 2 represents the change of the frequency in a room temperature (such as 25 DEG C.) environment, and a curve 3 represents the change of the frequency in a high temperature environment. As shown in FIG. 1, the frequency of the clock signal output by the OSC is affected by the temperature, moreover, the frequency in the low temperature environment is greater than the frequency in the room temperature environment, and the frequency in the high temperature environment is less than the frequency in the normal temperature environment.

As is known, the OSC in the display device is generally calibrated before the display device is shipped, so as to guarantee that the frequencies of the clock signals output by all the OSCs in the display device are the same at room temperature. However, during the use of the display device, the frequency of the clock signal output by the OSC will still be affected by the temperature and the display panel will still flash abnormally.

However, the problem cannot be solved in the use of the display device at present, which results in bad display such as abnormal flashing after the display is shipped. Therefore, it is urgent to provide a method for adjusting the frequency of the clock signal output by the OSC in the use of the display device, so as to guarantee normal display of the display panel.

Embodiments of the present disclosure provide a method for adjusting signal frequency. FIG. 2 is a flowchart of the method for adjusting signal frequency according to the embodiments of the present disclosure. As shown in FIG. 2, the method may include following steps.

In step 201, a first number of times of outputting a reference signal at an active level within a reference duration is acquired, wherein a correlation between a frequency of the reference signal and temperature is less than a reference correlation threshold, the reference duration is negatively correlated with a frequency of a clock signal, a correlation between the frequency of the clock signal and the temperature is greater than the reference correlation threshold, and a drive signal for driving a display device to display an image is generated based on the clock signal.

The output period of the reference signal is not greater than the reference duration, that is, the first number of times of outputting the reference signal at the active level within the reference duration is at least 1.

The reference correlation threshold may be determined according to application requirements. The correlation between the frequency of the reference signal and the temperature is less than the reference correlation threshold, which can ensure that the frequency of the reference signal is affected by the temperature within the range allowed by the application requirements, that is, the frequency of the reference signal may be considered not to be changed due to the temperature within the range allowed by the application requirements. Correspondingly, the correlation between the frequency of the clock signal and the temperature is greater than the reference correlation threshold, that is, the frequency of the clock signal will be changed due to the temperature. Exemplarily, the clock signal may be a clock signal output by the OSC.

As an implementable manner that the reference duration is negatively correlated with the clock signal, the reference duration may be equal to a duration consumed for outputting the clock signal at the active level for N times, where the value of N may be determined according to actual requirements. For example, as the drive signal supplied to the pixel unit of the display device is generated based on the clock signal, the reference duration may be equal to a total duration for providing the drive signal to one row of pixel units in the display device.

Since the temperature affects the frequency of the clock signal, when the reference duration is negatively correlated with the frequency of the clock signal, the reference duration changes according to the temperature and the frequency of the reference signal does not change according to the temperature. Therefore, by acquiring the first number of times of outputting the reference signal at the active level within the reference duration, it is possible to determine whether the temperature of the environment in which the display device is located changes, and thus determine whether the frequency of the clock signal changes.

In step 202, if the first number of times is different from a reference number of times, a target adjustment value based on the first number of times is acquired.

The reference number of times is a number of times of outputting the reference signal at the active level within the reference duration determined based on a reference frequency when the frequency of the clock signal is equal to the reference frequency. The reference frequency may be a preset frequency. When the frequency of the clock signal is equal to the reference frequency, the clock signal may be considered to meet a display requirement of the display device, that is, the display panel will not flash abnormally. For example, the reference frequency may be equal to the frequency of the clock signal at room temperature after the OSC in the display device is calibrated.

If the first number of times is different from the reference number of times, it indicates that the reference duration is changed relative to the duration consumed for outputting the reference signal at the active level for times of the reference number of times. Accordingly, the frequency of the output clock signal is changed, and the frequency of the clock signal needs to be adjusted.

Step 203, controlling and adjusting the frequency of the output clock signal based on the target adjustment value.

In conclusion, in the method for adjusting the signal frequency according to the embodiments of the present disclosure, the frequency of the output clock signal can be detected through comparison between the first number of times and the reference number of times, and the frequency of the clock signal can be adjusted when the frequency of the clock signal does not meet the requirement. Compared with the related art, the method can adjust the frequency of the output clock signal in the use of the display device and guarantee normal transmission of the drive signal, thereby ensuring the display effect of the display panel.

Generally, the clock signal is output by a clock signal generator of the display device. the method for adjusting the signal frequency will be described as below by taking the fact that the clock signal is output by the clock signal generator as an example. As shown in FIG. 3, the method may include following steps.

In step 301, the clock signal output by the clock signal generator is acquired.

Optionally, the clock signal generator is an oscillator circuit. As the characteristics of components in the oscillator circuit is prone to be affected by the temperature, when the display device is located at different temperatures, the frequencies of the clock signals output by the oscillator circuit are different. Therefore, the temperature at which the display device is located can be detected by acquiring the clock signal output by the oscillator circuit, such that the frequency of the output clock signal may be adjusted according to the temperature at which the display device is located, thereby making the display device be capable to normally display the clock signal at different temperatures.

In step 302, the reference duration based on the frequency of the clock signal is determined.

The correlation between the frequency of the clock signal and the temperature is greater than a reference correlation threshold, that is, the frequency of the clock signal will be changed due to the temperature. Exemplarily, the clock signal may be a clock signal output by the OSC.

Optionally, the reference duration may be negatively correlated with the frequency of the clock signal. As an implementable manner of the negative correlation, the reference duration may be equal to a duration consumed for outputting the clock signal at the active level by the clock signal generator for N times. Accordingly, the implementation process for the step 302 may include: determining the duration consumed for outputting the clock signal at the active level by the clock signal generator for N times as the reference duration, where N is a positive integer. The value of N may be determined according to the actual requirements, and the value of N may be predetermined before the frequency of the signal is adjusted.

In an implementable manner, as the drive signal supplied to the pixel unit of the display device is generated based on the clock signal, the reference duration may be equal to a total duration for providing the drive signal to one row of pixel units in the display device, that is, N may be determined based on the total number of one row of pixel units.

Exemplarily, it is assumed that the clock signals at the active level need to be supplied for 239 times when scanning one row of pixel units of the display panel, the reference duration may be equal to a duration consumed for providing the clock signals at the active level for 239 times. Moreover, in a certain display process of the display panel, it is assumed that the duration consumed for outputting the clock signals at the active level by the clock signal generator for 239 times is $239*(2*10^{-8})$ seconds, the reference duration may be $4.78*10^{-6}$ seconds.

In step 303, the first number of times of outputting the reference signal at the active level within the reference duration is acquired.

The output period of the reference signal is not greater than the reference duration, that is, the first number of times of outputting the reference signal at the active level within the reference duration is at least 1. The reference correlation threshold may be determined according to application requirements. The correlation between the frequency of the reference signal and the temperature is less than the reference correlation threshold, which can ensure that the frequency of the reference signal is affected by the temperature within the range allowed by the application requirements, that is, the frequency of the reference signal may be considered not to be changed due to the temperature within the range allowed by the application requirements.

In one example, the reference correlation threshold may be equal to 0. In another example, the reference correlation threshold may be a correlation coefficient between the frequency of the reference signal and the temperature when the influence on the frequency of the reference signal by the temperature may be negligible within an error range. For example, within an allowable error range of a certain application scenario, it is assumed that the correlation coefficient between the frequency of the reference signal and the temperature is less than 0.01, and the influence on the frequency of the reference signal by the temperature may be considered negligible, the reference correlation threshold may be 0.01 at this time.

Optionally, the reference signal may be generated by a reference signal generator in the display device. Moreover, the reference signal may be a data signal. Exemplarily, when the display device is a mobile terminal, the reference signal may be a signal transmitted by a mobile industry processor interface (MIPI). The signal transmitted by the MIPI is typically generated by a phase-locked loop in a mainboard of the mobile terminal. As the phase-locked loop is generally provided with a feedback loop, a circuit system for generating the signal becomes a closed-loop system. Moreover, the phase-locked loop works based on a reference signal with a fixed frequency, such that the phase-locked loop is slightly influenced by the temperature, and the precision of the signal generated by the phase-locked loop is thereof higher. Therefore, taking the signal transmitted by the MIPI as the reference signal can ensure the accuracy of the frequency of the clock signal adjusted based on the reference signal.

In step 304, if the first number of times is different from the reference number of times, a target adjustment value based on the first number of times is acquired.

The reference number of times is a number of times of outputting the reference signal at the active level within the reference duration determined based on a reference frequency when the frequency of the clock signal is equal to the reference frequency. The reference frequency may be a preset frequency. When the frequency of the clock signal is equal to the reference frequency, the clock signal may be considered to meet a display requirement of the display device, that is, the display panel will not flash abnormally. For example, the reference frequency may be equal to the frequency of the clock signal at room temperature after the OSC in the display device is calibrated.

If the first number of times is different from the reference number of times, it indicates that the reference duration is changed relative to the duration consumed for outputting the reference signal at the active level for times of the reference number of times. Accordingly, the frequency of the output clock signal is changed, and the frequency of the clock signal needs to be adjusted.

In an implementable manner for acquiring the target adjustment value, a target difference value between the first number of times and the reference number of times may be acquired firstly, and then the target adjustment value is acquired based on the target difference value. For example, a corresponding relationship between the difference value of the number of times and the adjustment value may be prestored in the display device, during the acquisition of the target adjustment, the corresponding relationship may be inquired according to the target difference value, and the adjustment value corresponding to the target difference value is determined as the target adjustment value.

Alternatively, the adjustment value to be adjusted when the difference values of the number of times are different is acquired in advance by adopting modes such as experiment tests, a function mapping relation between the difference value of the number of times and the adjustment value is determined based on the big data processing mode. The target adjustment value can be acquired by substituting the target difference value into the function mapping relationship after the target difference value is determined.

Alternatively, as the temperature decreases, the frequency of the output clock signal increases and the reference duration becomes shorter, resulting in that the first number of times of outputting the reference signal at the active level within the reference duration decreases. As the temperature increases, the frequency of the output clock signal decreases and the reference duration becomes longer, resulting in that the first number of times of outputting the reference signal at the active level within the reference duration increases. Therefore, if the first number of times is different from the reference number of times, whether the frequency of the output clock signal needs to be increased or decreased may be determined according to the first number of times and the reference number of times. Accordingly, if the first number of times is greater than the reference number of times, the target adjustment value for indicating to increase the frequency may be acquired based on the first number of times. If the first number of times is less than the reference number of times, the target adjustment value for indicating to reduce the frequency may be acquired based on the first number of times.

An application scenario of the implementation manner may include: adjusting the frequency of the output clock signal according to a fixed adjustment value in the adjusting process at each time; acquiring the first number of times again after adjusting the frequency of the clock signal according to the fixed adjustment value at each time; adjusting the frequency of the clock signal according to the first number of times until the first number of times of outputting the reference signal at the active level within the reference duration is equal to the reference number of times; and determining that the adjusting task is completed. At this time, the target adjustment value may be used for indicating to increase or reduce the frequency of the clock signal according to the frequency of the clock signal.

Figure 4:
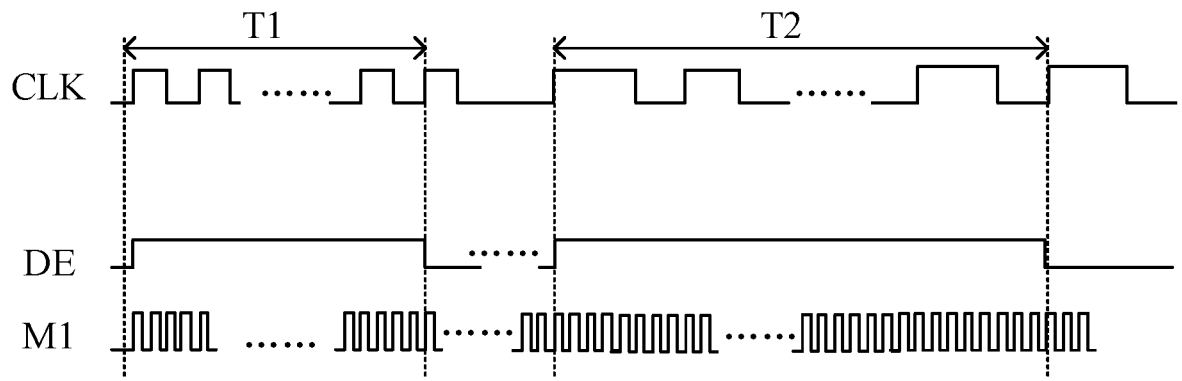
FIG. 4 is a schematic diagram of a driving process of pixel units according to embodiments of the present disclosure.

Exemplarily, as shown in FIG. 4, an enable signal DE is configured to control the supply of the drive signal to the pixel unit. When the enable signal DE is at a high level, the drive signal may be supplied to the pixel unit. When the enable signal DE is at a low level, the supply of the drive signal to the pixel unit may be stopped. Within a time T1, the display device is in a normal temperature environment, the frequency of the clock signal CLK output by the oscillator circuit is 1 gigahertz and the frequency of the reference signal M1 is 0.25 gigahertz. Within the duration of providing the drive signal to the row of pixel units, the oscillator circuit outputs 239 periods of clock signals CLK and the reference signal generator generates 479 periods of reference signals M1, that is, the reference number of times is 479. Within a time T2, the display device is in a high temperature environment, the frequency of the clock signal CLK output by the oscillator circuit is changed into 0.5 gigahertz and the frequency of the reference signal M1 is still 0.25 gigahertz. As the frequency of the clock signal is changed, the duration of providing the drive signal to the row of pixel units is prolonged, the reference signal generator generates 899 periods of reference signals M1 within the time, that is, the first number of times is 899. The first number of times is different from the reference number of times. At this time, the target adjustment value needs to be acquired, and the frequency of the clock signal CLK is adjusted according to the target adjustment value.

In step 305, based on the target adjustment value, the amplitude of an input voltage supplied to the clock signal generator is adjusted, such that the clock signal generator is capable of adjusting the frequency of the clock signal under the adjusted input voltage.

Optionally, the frequency of the clock signal output by the clock signal generator may be determined by the input voltage supplied to the clock signal generator, and when the input voltage is higher, the frequency of the clock signal output by the clock signal generator is higher. Therefore, the frequency of the clock signal may be adjusted by adjusting the amplitude of the input voltage supplied to the clock signal generator.

In one implementable manner, a target parameter in an input voltage control instruction may be adjusted based on the target adjustment value, and the input voltage control instruction after the target parameter is adjusted is executed to adjust the amplitude of the input voltage. The input voltage control instruction is intended to instruct to supply the input voltage to the clock signal generator, and the amplitude of the input voltage is determined by the target parameter. Therefore, the amplitude of the input voltage can be adjusted by adjusting the target parameter, such that the frequency of the output clock signal is adjusted. After the frequency of the clock signal is adjusted, the drive circuit in the display device can output a drive signal meeting the requirements according to the clock signal, such that the display effect of the display panel is improved. The amplitude of the input voltage is positively correlated with the target parameter.

For example, the input voltage supplied to the clock signal generator may be acquired according to a reference pulse signal, and the amplitude of the input voltage may be determined according to a duty cycle of the reference pulse signal. In this way, the amplitude of the input voltage can be adjusted by adjusting the duty cycle of the reference pulse signal. that is, the target parameter may be the duty cycle of the reference pulse signal. Moreover, the amplitude of the input voltage can be increased by increasing the duty cycle of the reference pulse signal, and accordingly, the frequency of the clock signal output by the clock signal generator can be increased.

Exemplarily, the target adjustment value may be a value of the adjusted target parameter. It is assumed that the acquired target adjustment value is 50, the target parameter may be set as 50. After the input voltage control instruction with the target parameter adjusted is executed, the input voltage supplied to the clock signal generator may be changed, and the clock signal generator may output the clock signal with the frequency meeting the condition under the control of the input voltage, such that the frequency of the output clock signal is adjusted.

It should be noted that, step 304 and step 305 may be performed by registers. For example, the display device may be provided with a reading register and a writing register, the reading register may store the corresponding relationship between the difference value of number of times and an adjustment value, and the writing register may store the input voltage control instruction. After the target difference value of the first number of times and the reference number of times is acquired, the target adjustment value corresponding to the target difference value can be acquired by reading the corresponding relationship in the reading register, and the target parameter in the input voltage control instruction in the writing register is adjusted according to the target adjustment value, such that the frequency of the output clock signal is adjusted.

In conclusion, in the method for adjusting the signal frequency according to the embodiments of the present disclosure, the frequency of the output clock signal can be detected through comparison between the first number of times and the reference number of times, and the frequency of the clock signal can be adjusted when the frequency of the clock signal does not meet the requirement. Compared with the related art, the method may adjust the frequency of the output clock signal in the use of the display device and ensure normal transmission of the drive signal, thereby ensuring the display effect of the display panel.

Moreover, when the factor affecting the frequency of the clock signal is temperature, for example, when the oscillator circuit is affected by the temperature to result in that the frequency of the clock signal output by the oscillator circuit does not meet the application requirement, the temperature of the display device can be detected by comparing the first number of times with the reference number of times, and the display device is subjected to other control related to the temperature according to the temperature detection result, In this way, the display device does not need to be provided with a temperature detection circuit, thereby reducing the cost of the display device. For example, the charging capability of the pixel circuit in the display device may be compensated according to the temperature, such that the display effect of the display device is further ensured.

It should be noted that the sequence of steps in the method for adjusting the signal frequency according to the embodiments of the present disclosure may be properly adjusted, and the steps may be increased or reduced correspondingly according to the conditions. Any methods which those skilled in the art may think in the technical scope disclosed by the present disclosure should be covered within the protection scope of the present disclosure, thus it will not be elaborated.

Figure 5:
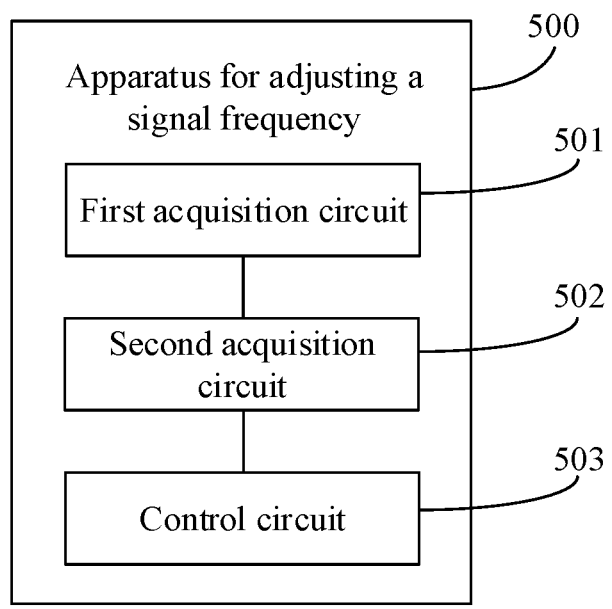
FIG. 5 is a schematic structural diagram of an apparatus for adjusting a signal frequency according to embodiments of the present disclosure.

An embodiment of the present disclosure further provides an apparatus 500 for adjusting a signal frequency. As shown in FIG. 5, the apparatus 500 for adjusting the signal frequency may include:

a first acquisition circuit 501, configured to acquire a first number of times of outputting a reference signal at an active level within a reference duration, wherein a correlation between a frequency of the reference signal and temperature is less than a reference correlation threshold, the reference duration is negatively correlated with a frequency of a clock signal, a correlation between a frequency of a clock signal and temperature is greater than the reference correlation threshold, and a drive signal for driving a display device to display an image is generated based on the clock signal;

a second acquisition circuit 502, configured to acquire a target adjustment value based on the first number of times if the first number of times is different from the reference number of times; and a control circuit 503, configured to control and adjust the frequency of the output clock signal based on the target adjustment value.

In conclusion, in the apparatus for adjusting the signal frequency according to the embodiment of the present disclosure, the frequency of the output clock signal may be detected through comparison between the first number of times and the reference number of times, and the frequency of the clock signal can be adjusted when the frequency of the clock signal does not meet the requirement. Compared with the related art, the device may adjust the frequency of the output clock signal in the use of the display device and guaranteeing normal transmission of the drive signal, thereby ensuring the display effect of the display panel.

Optionally, the reference duration is equal to a duration consumed for outputting the clock signals at the active level for N times.

Optionally, the reference number of times is a number of times of outputting the reference signals at the active level within the reference duration determined based on a reference frequency when the frequency of the clock signal is equal to the reference frequency.

Optionally, the clock signal is output by a clock signal generator in the display device. The control circuit 503 is configured to adjust an amplitude of an input voltage supplied to the clock signal generator based on the target adjustment value, such that the clock signal generator is capable of adjusting the frequency of the clock signal under the adjusted input voltage.

Optionally, the control circuit 503 is specifically configured to:

adjust a target parameter in an input voltage control instruction based on the target adjustment value, wherein the input voltage control instruction is intended to instruct to supply the input voltage to the clock signal generator, and the amplitude of the input voltage is determined based on the target parameter; and adjust the amplitude of the input voltage by executing the input voltage control instruction with the target parameter adjusted.

Optionally, the amplitude of the input voltage is positively correlated with the target parameter.

Figure 6:
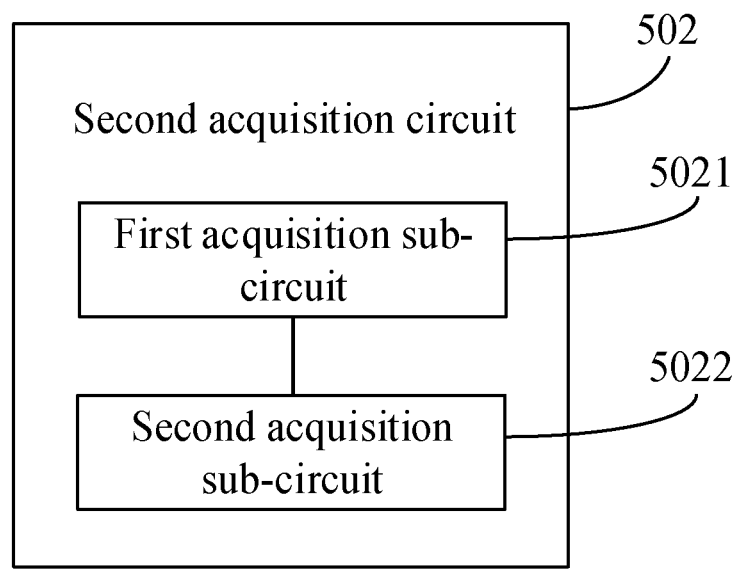
FIG. 6 is a schematic structural diagram of a second acquisition circuit according to embodiments of the present disclosure.

Optionally, as shown in FIG. 6, the second acquisition circuit 502 may include:

a first acquisition sub-circuit 5021, configured to acquire a target difference value between the first number of times and the reference number of times;

a second acquisition sub-circuit 5022, configured to determine an adjustment value corresponding to the target difference value as a target adjustment value based on a corresponding relationship between the difference value of number of times and the adjustment value.

Optionally, the second acquisition circuit 502 is configured to:

acquire the target adjustment value for indicating to increase the frequency of the clock signal based on the first number of times if the first number of times is greater than the reference number of times; and acquire the target adjustment value for indicating to reduce the frequency of the clock signal based on the first number of times if the first number of times is less than the reference number of times.

Figure 7:
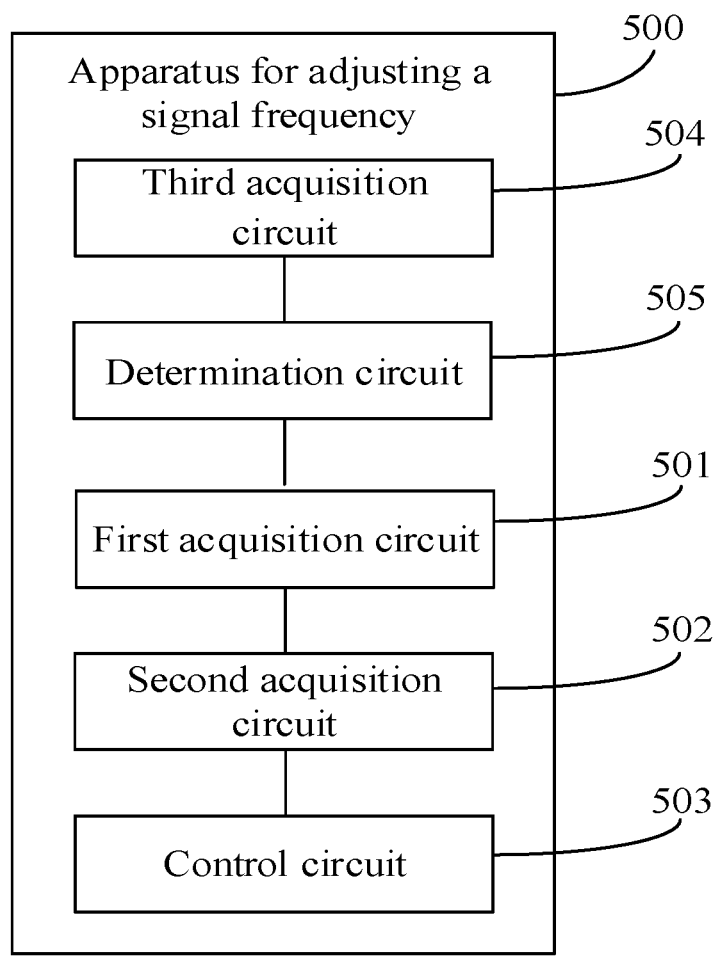
FIG. 7 is a schematic structural diagram of another apparatus for adjusting a signal frequency according to embodiments of the present disclosure.

Optionally, the clock signal is output by the clock signal generator in the display device, as shown in FIG. 7, the apparatus 500 may further include:

a third acquisition circuit 504, configured to acquire the clock signal output by the clock signal generator; and a determination circuit 505, configured to determine a duration consumed for outputting the clock signals at the active level for N times as a reference number of times, wherein N is a positive integer.

optionally, the reference duration is equal to a total duration for providing a drive signal to one row of pixel units in the display device.

Optionally, the reference signal may be a data signal.

Optionally, the display device is a mobile terminal, and the reference signal is a signal transmitted by a mobile industry processor interface (MIPI).

Optionally, the clock signal is output by an oscillator circuit.

In conclusion, in the apparatus for adjusting the signal frequency according to the embodiment of the present disclosure, the frequency of the output clock signal may be detected through comparison between the first number of times and the reference number of times, and the frequency of the clock signal can be adjusted when the frequency of the clock signal does not meet the requirement. Compared with the related art, the apparatus can adjust the frequency of the output clock signal in the use of the display device and guarantee normal transmission of the drive signal, thereby ensuring the display effect of the display panel.

Moreover, when the factor affecting the frequency of the clock signal is temperature, for example, when the oscillator circuit is affected by the temperature to result in that the frequency of the clock signal output by the oscillator circuit does not meet the application requirement, the temperature of the display device can be detected by comparing the first number of times with the reference number of times, and the display device is subjected to other control related to the temperature according to the temperature detection result, in this way, the display device does not need to be provided with a temperature detection circuit, thereby reducing the cost of the display device. For example, the charging capability of the pixel circuit in the display device can be compensated according to the temperature, such that the display effect of the display device is further ensured.

An embodiment of the present disclosure provides a display device. The display device includes a processor and a memory, wherein the memory stores at least one program, which, when being executed by the processor, is enabled to perform the method for adjusting the signal frequency according to the embodiments of the present disclosure when the at least one program is executed by the processor.

The memory may include a volatile memory, such as a random-access memory (RAM). The memory may further include a non-volatile memory, such as a flash memory, a hard disk drive (HDD) or a solid-state drive (SSD). And the memory may further include a combination of the above memories.

The processor may be a hardware chip and is configured to perform a display control method according to the present disclosure when executing the computer program. The hardware chip may be an application-specific integrated circuit (ASIC), a programmable logic device (PLD) or a combination thereof. The PLD may be a complex programmable logic device (CPLD), a field-programmable gate array (FPGA), a generic array logic (GAL) or any combination thereof. Alternatively, the processor may further be a generic processor, such as a central processing unit (CPU), a network processor (NP) or a combination of the CPU and the NP.

Figure 8:
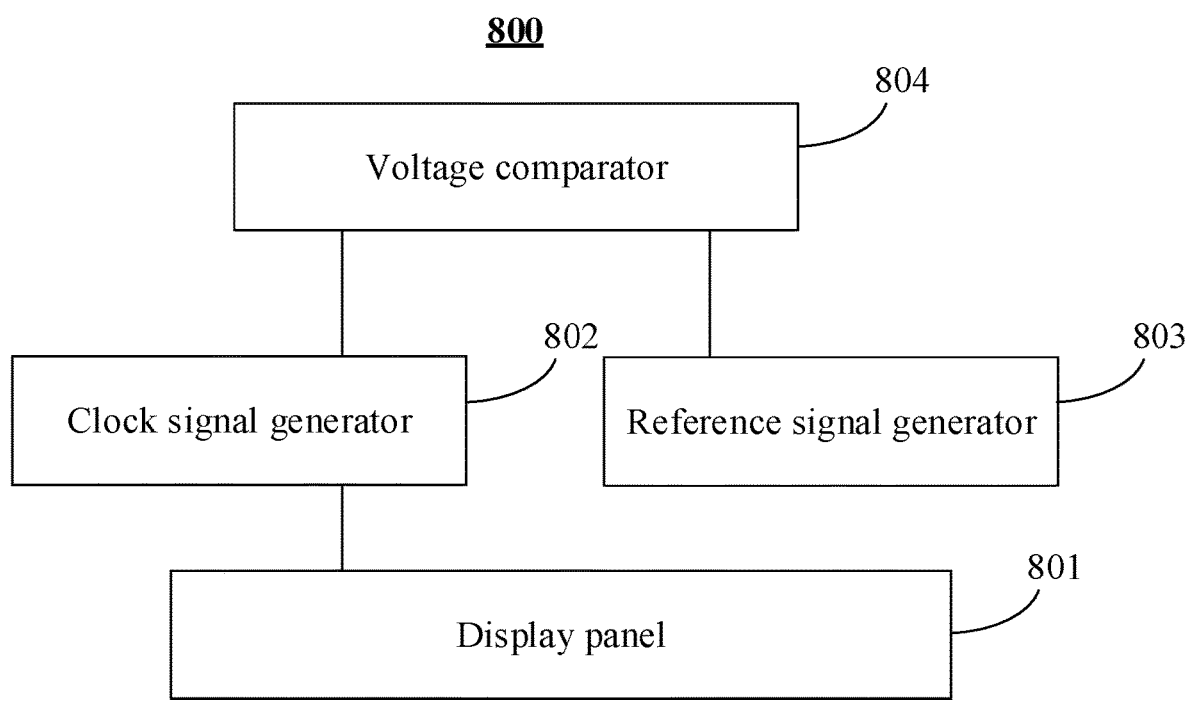
FIG. 8 is a structure block diagram of a display device according to embodiments of the present disclosure.

Optionally, as shown in FIG. 8, the display device 800 may include: a display panel 801, a clock signal generator 802, a reference signal generator 803 and a voltage comparator 804.

The reference signal generator 803 is configured to generate a reference signal and supply the reference signal to the voltage comparator 804.

The clock signal generator 802 is configured to generate a clock signal and supply the clock signal to the voltage comparator 804. A drive signal is generated based on the clock signal, and the drive signal is intended to drive the display panel 801 to display an image.

The voltage comparator 804 is configured to determine a reference duration based on the clock signal under the control of the processor and by the method for adjusting the signal frequency according to the embodiments, and control and adjust the frequency of the output clock signal based on the clock signal and the reference signal.

Optionally, the display device may be any products or parts with a display function, such as a display panel, a mobile phone, a tablet personal computer, a television, a display, a notebook computer, a digital photo frame, a navigator, etc.

An embodiment of the present disclosure provides a storage medium storing a computer program therein, wherein the computer program, when being executed by a processor, is enabled to perform the method for adjusting the signal frequency according to the above embodiments.

Optionally, the storage medium may include: various mediums capable of storing program codes, such as a read-only memory (ROM) or a random access memory (RAM), a magnetic disk, an optical disk, or the like.

An embodiment of the present disclosure provides a chip. The chip includes a programmable logic circuit and/or a program instruction. The method for adjusting the signal frequency according to the embodiments is implemented when running the chip.

An embodiment of the present disclosure further provides a computer program product including at least one instruction. When running on a computer, the computer program product causes the computer to perform the method for adjusting the signal frequency according to the embodiments.

Optionally, the computer may be a general computer, a special computer, a computer network or other programmable devices. The computer program product may be stored in the computer readable storage medium, or may be transmitted through the computer readable storage medium.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A method for adjusting a signal frequency, comprising:
    acquiring a clock signal output by a clock signal generator;
    determining a reference duration based on a frequency of the clock signal, wherein the reference duration is negatively correlated with the frequency of the clock signal;
    acquiring a first number of times of outputting a reference signal at an active level within the reference duration, wherein a correlation between a frequency of the reference signal and a temperature is less than a reference correlation threshold, a correlation between the frequency of the clock signal and the temperature is greater than the reference correlation threshold, and a drive signal for driving a display device to display an image is generated based on the clock signal;
    acquiring a target difference value between the first number of times and a reference number of times, wherein the reference number of times is a number of times of outputting the reference signal at the active level within the reference duration determined based on a reference frequency when the frequency of the clock signal is equal to the reference frequency;
    determining an adjustment value corresponding to the target difference value as the target adjustment value based on a corresponding relationship between a difference value of the number of times and the adjustment value; and
    controlling and adjusting the frequency of the output clock signal based on the target adjustment value.

2. The method according to claim 1, wherein the reference duration is equal to a duration consumed for outputting the clock signal at the active level for N times.

3. The method according to claim 1, wherein controlling and adjusting the frequency of the output clock signal based on the target adjustment value comprises:
    adjusting an amplitude of an input voltage supplied to the clock signal generator based on the target adjustment value, such that the clock signal generator is capable of adjusting the frequency of the clock signal under the adjusted input voltage.

4. The method according to claim 3, wherein adjusting the amplitude of the input voltage supplied to the clock signal generator based on the target adjustment value comprises:
    adjusting a target parameter in an input voltage control instruction based on the target adjustment value, wherein the input voltage control instruction is intended to instruct to supply the input voltage to the clock signal generator, and the amplitude of the input voltage is determined based on the target parameter; and adjusting the amplitude of the input voltage by executing the input voltage control instruction with the target parameter adjusted.

5. The method according to claim 4, wherein the amplitude of the input voltage is positively correlated with the target parameter.

6. The method according to claim 1, wherein the reference duration is equal to a total duration for supplying the drive signal to one row of pixel units in the display device.

7. The method according to claim 1, wherein the reference signal is a data signal.

8. The method according to claim 7, wherein the display device is a mobile terminal, and the reference signal is a signal transmitted by a mobile industry processor interface (MIPI).

9. The method according to claim 1, wherein the clock signal is output by an oscillator circuit.

10. A non-transitory storage medium storing a computer program therein, wherein when being executed by a processor, the computer program is enabled to perform the method for adjusting the signal frequency as defined in claim 1.

11. An apparatus for adjusting a signal frequency, comprising:
a first acquisition circuit, configured to acquire a clock signal output by a clock signal generator; determine a reference duration based on a frequency of the clock signal; and acquire a first number of times of outputting a reference signal at an active level within the reference duration, wherein a correlation between a frequency of the reference signal and temperature is less than a reference correlation threshold, the reference duration is negatively correlated with the frequency of the clock signal, a correlation between the frequency of the clock signal and the temperature is greater than the reference correlation threshold, and a drive signal for driving a display device to display an image is generated based on the clock signal;
a second acquisition circuit, configured to acquire a target difference value between the first number of times and a reference number of times, wherein the reference number of times is a number of times of outputting the reference signal at the active level within the reference duration determined based on a reference frequency when the frequency of the clock signal is equal to the reference frequency; and determine an adjustment value corresponding to the target difference value as the target adjustment value based on a corresponding relationship between a difference value of the number of times and the adjustment value; and
a control circuit, configured to control and adjust the frequency of the output clock signal based on the target adjustment value.

12. The apparatus according to claim 11, wherein the reference duration is equal to a duration consumed for outputting the clock signal at the active level for N times.

13. The apparatus according to claim 11, wherein the control circuit is configured to:
adjust an amplitude of an input voltage supplied to the clock signal generator based on the target adjustment value, such that the clock signal generator is capable of adjusting the frequency of the clock signal under the adjusted input voltage.

14. The apparatus according to claim 13, wherein the control circuit is configured to:

adjust a target parameter in an input voltage control instruction based on the target adjustment value, wherein the input voltage control instruction is intended to instruct to supply the input voltage to the clock signal generator, and the amplitude of the input voltage is determined based on the target parameter; and
adjust the amplitude of the input voltage by executing the input voltage control instruction with the target parameter adjusted.

15. A display device, comprising:
a processor; and
a memory;
wherein the memory stores at least one program, which, when being executed by the processor, is enabled to perform the following steps:
acquiring a clock signal output by a clock signal generator;
determining a reference duration based on a frequency of the clock signal, wherein the reference duration is negatively correlated with the frequency of the clock signal;
acquiring a first number of times of outputting a reference signal at an active level within the reference duration, wherein a correlation between a frequency of the reference signal and a temperature is less than a reference correlation threshold, a correlation between the frequency of the clock signal and the temperature is greater than the reference correlation threshold, and a drive signal for driving a display device to display an image is generated based on the clock signal;
acquiring a target difference value between the first number of times and a reference number of times, wherein the reference number of times is a number of times of outputting the reference signal at the active level within the reference duration determined based on a reference frequency when the frequency of the clock signal is equal to the reference frequency;
determining an adjustment value corresponding to the target difference value as the target adjustment value based on a corresponding relationship between a difference value of the number of times and the adjustment value; and
controlling and adjusting the frequency of the output clock signal based on the target adjustment value.

16. The display device according to claim 15, wherein the display device comprises: a display panel, the clock signal generator, a reference signal generator, and a voltage comparator; wherein
the reference signal generator is configured to generate a reference signal and supply the reference signal to the voltage comparator;
the clock signal generator is configured to generate the clock signal and supply the clock signal to the voltage comparator; wherein a drive signal is generated based on the clock signal, the drive signal for driving the display panel to display an image; and
the voltage comparator is configured to determine the reference duration based on the clock signal and under the control of the processor, and further control and adjust the frequency of the output clock signal based on the clock signal and the reference signal.

* * * * *